(12) United States Patent
Kim et al.

(10) Patent No.: US 10,205,558 B2
(45) Date of Patent: Feb. 12, 2019

(54) SIGNAL RECEPTION APPARATUS, BLOCK DECODING UNIT AND METHOD THEREOF IN RADIO COMMUNICATION SYSTEM

(71) Applicant: Samsung Electronics Co., Ltd., Suwon-si, Gyeonggi-do (KR)

(72) Inventors: Deok-Hwan Kim, Anseong-si (KR); Seong-Wook Song, Gwacheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 89 days.

(21) Appl. No.: 15/595,355

(22) Filed: May 15, 2017

(65) Prior Publication Data
US 2017/0250783 A1    Aug. 31, 2017

Related U.S. Application Data

(62) Division of application No. 14/061,142, filed on Oct. 23, 2013.

(30) Foreign Application Priority Data

Jan. 16, 2013    (KR) .......................... 10-2013-0004955

(51) Int. Cl.
*H04L 1/00*    (2006.01)
*G06F 11/08*    (2006.01)
*H03M 13/00*    (2006.01)

(52) U.S. Cl.
CPC ............ *H04L 1/0057* (2013.01); *G06F 11/08* (2013.01); *H04L 1/0046* (2013.01); *H04L 1/0059* (2013.01); *H03M 13/6356* (2013.01)

(58) Field of Classification Search
CPC .................... H03M 13/6356; H04L 1/0057
See application file for complete search history.

(56) References Cited

U.S. PATENT DOCUMENTS

| | | | |
|---|---|---|---|
| 6,205,186 B1 | 3/2001 | Butler et al. | |
| 6,418,407 B1* | 7/2002 | Huang | G10L 25/90 704/207 |
| 7,415,041 B2* | 8/2008 | Harris | H04W 52/262 370/338 |
| 7,924,950 B2* | 4/2011 | Chen | H03M 13/3746 375/341 |
| 2003/0207696 A1 | 11/2003 | Willenegger et al. | |
| 2006/0121911 A1 | 6/2006 | Zhang et al. | |
| 2006/0146757 A1 | 7/2006 | Harris | |
| 2006/0182182 A1* | 8/2006 | Nakajima | H04N 19/61 375/240.25 |
| 2007/0076660 A1* | 4/2007 | Sung | H04W 4/10 370/329 |
| 2012/0294694 A1* | 11/2012 | Garot | F27D 1/141 411/427 |

FOREIGN PATENT DOCUMENTS

KR    10-2007-0087633 A    8/2007

* cited by examiner

*Primary Examiner* — Steve N Nguyen
(74) *Attorney, Agent, or Firm* — Jefferson IP Law, LLP

(57) ABSTRACT

A method for decoding a channel signal in a signal reception apparatus is provided. The method includes performing a block decoding operation on a channel signal block, and if the block decoding for the channel signal block fails, re-performing a block decoding operation on the channel signal block using a preset pattern.

7 Claims, 5 Drawing Sheets

SIGNAL RECEPTION APPARATUS, BLOCK DECODING UNIT AND METHOD THEREOF IN RADIO COMMUNICATION SYSTEM

PRIORITY

This application is a divisional application of prior application Ser. No. 14/061,142, filed on Oct. 23, 2013, which claimed the benefit under 35 U.S.C. § 119(a) of a Korean patent application filed on Jan. 16, 2013 in the Korean Intellectual Property Office and assigned Serial number 10-2013-0004955, the entire disclosure of which is hereby incorporated by reference.

BACKGROUND OF THE INVENTION

1. Field of the Invention

The present invention relates to a signal reception apparatus, a block decoding unit and a method thereof in a radio communication system. More particularly, the present invention relates to a signal reception apparatus, a block decoding unit and a method thereof in a radio communication system thereby enhancing a block decoding performance for a channel signal block using a preset pattern.

2. Description of the Related Art

In a radio communication system of the related art, a Mobile Station (MS) transits into a sleep mode in order to minimize power consumption if the MS does not transmit/receive a data channel signal to/from a Base Station (BS) during a preset time interval.

The MS which has transited into the sleep mode may receive a control channel signal during a preset listening interval. If the MS's reception performance is less than a threshold reception performance during the preset listening interval, the MS may not properly receive the control channel signal, and detect important control information included in the control channel signal.

If the control channel signal is a Paging CHannel (PCH) signal and the MS's reception performance is less than the threshold reception performance during the preset listening interval, the MS may not receive the PCH signal. Accordingly, the MS may not receive a call even though a calling party MS continuously tries to call.

An example of the radio communication system is a Global System for Mobile communications (GSM) communication system, and an example of the control channel signal is the PCH signal. A PCH signal transmission/reception processes in the GSM communication system will be followed.

If paging information data targeting an MS occurs, a BS generates a final PCH signal, i.e., a PCH data block by encoding the paging information data using preset encoding schemes, e.g., a block encoding scheme and a convolutional encoding scheme, performing an interleaving operation on the encoded paging information data using a preset interleaving scheme, and modulating the interleaved paging information data using a preset modulation scheme, e.g., a Gaussian filtered Minimum Shift Keying (GMSK) scheme, and transmits the PCH data block to the MS. Since a size of the paging information data is relatively small, the PCH data block includes a preset pattern, e.g., a 0x2B padding block as well as the paging information data, i.e., a paging information data block.

The MS detects a final PCH data block by receiving a PCH signal from the BS, de-modulating the PCH signal corresponding to the modulation scheme used in the BS, i.e., the GMSK scheme, de-interleaving the de-modulated PCH signal corresponding to the interleaving scheme used in the BS, and decoding the de-interleaved PCH signal using a Viterbi decoding scheme and a Fire decoding scheme.

If the control channel signal, such as the PCH signal, is not received ordinarily, serious performance degradation in a total radio communication system may occur.

Therefore, there is a need for enhancing an error correction performance and an error detection performance for the control channel signal.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a signal reception apparatus, a block decoding unit and a method thereof in a radio communication system.

Another aspect of the present invention proposes a signal reception apparatus, a block decoding unit and a method thereof in a radio communication system thereby enhancing an error detection performance.

Another aspect of the present invention proposes an apparatus and a method for decoding a signal including a pattern known between a signal transmission apparatus and a signal reception apparatus in a radio communication system.

Another aspect of the present invention proposes an apparatus and a method for decoding a signal by performing an additional decoding operation using a pattern known between a signal transmission apparatus and a signal reception apparatus in a radio communication system thereby enhancing an error detection performance.

In accordance with an aspect of the present invention, a signal reception apparatus is provided. The apparatus includes a block decoding unit for performing a block decoding operation on a channel signal block, and if the block decoding for the channel signal block fails, for re-performing a block decoding operation on the channel signal block using a preset pattern.

In accordance with another aspect of the present invention, a block decoding unit in a signal reception apparatus is provided. The block decoding unit includes a block decoder for performing a block decoding operation on a channel signal block, and if the block decoding for the channel signal block fails, for re-performing a block decoding operation on the channel signal block using a preset pattern.

In accordance with another aspect of the present invention, a method for decoding a channel signal in a signal reception apparatus is provided. The method includes performing a block decoding operation on a channel signal block, and if the block decoding for the channel signal block fails, re-performing a block decoding operation on the channel signal block using a preset pattern.

In accordance with another aspect of the present invention, a method for decoding a channel signal in a decoding unit of a signal reception apparatus is provided. The method includes performing a block decoding operation on a channel signal block, and if the block decoding for the channel signal block fails, re-performing a block decoding operation on the channel signal block using a preset pattern.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

Figure 1:
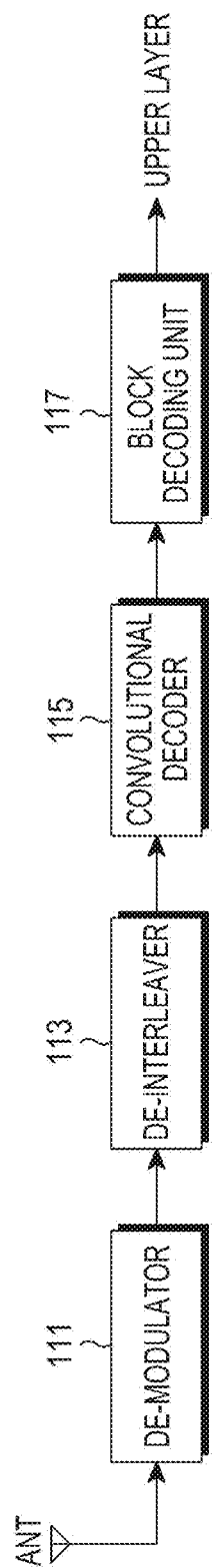
FIG. 1 is a block diagram of an inner structure of a signal reception apparatus in a radio communication system according to an exemplary embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

An exemplary embodiment of the present invention proposes a signal reception apparatus, a block decoding unit and a method thereof in a radio communication system.

An exemplary embodiment of the present invention proposes a signal reception apparatus, a block decoding unit and a method thereof in a radio communication system thereby enhancing a block decoding performance for a channel signal block using a preset pattern.

An exemplary embodiment of the present invention proposes a signal reception apparatus, a block decoding unit and a method thereof in a radio communication system thereby enhancing an error detection performance.

An exemplary embodiment of the present invention proposes an apparatus and a method for decoding a signal including a pattern known between a signal transmission apparatus and a signal reception apparatus in a radio communication system.

Exemplary embodiments of the present invention propose an apparatus and a method for decoding a signal by performing an additional decoding operation using a pattern known between a signal transmission apparatus and a signal reception apparatus in a radio communication system thereby enhancing an error detection performance.

Exemplary embodiments of the present invention will be described below with reference to a Global System for Mobile communications (GSM) communication system. However, it will be understood by those of ordinary skill in the art that exemplary embodiments of the present invention may be applied to any one of a Long-Term Evolution (LTE) mobile communication system, an LTE-Advanced (LTE-A) mobile communication system, an Evolved Packet System (EPS), an Institute of Electrical and Electronics Engineers (IEEE) 802.16m mobile communication system, and the like.

For convenience, it will be assumed that the signal is a Paging CHannel (PCH) signal. However, it will be understood by those of ordinary skill in the art that exemplary embodiments of the present invention may be applied to any one of all signals including a padding block with a pattern which has been known between a signal transmission apparatus and a signal reception apparatus included in a related block.

For convenience, it will be assumed that a signal reception apparatus proposed in exemplary embodiments of the present invention is implemented in a Mobile Station (MS). However, it will be understood by those of ordinary skill in the art that an entity in which the signal reception apparatus is implemented is not limited.

FIG. 1 schematically illustrates an inner structure of a signal reception apparatus in a radio communication system according to an exemplary embodiment of the present invention.

Referring to FIG. 1, the signal reception apparatus includes a de-modulator 111, a de-interleaver 113, a convolutional decoder 115, and a block decoding unit 117.

A PCH signal received through an antenna, i.e., a PCH data block, is input to the de-modulator 111, and the de-modulator 111 de-modulates the PCH data block based on a modulation scheme which has been used in a modulator included in a signal transmission apparatus, i.e., a Gaussian filtered Minimum Shift Keying (GMSK) scheme, and outputs the de-modulated PCH data block to the de-interleaver 113. The de-interleaver 113 de-interleaves the de-modulated PCH data block based on an interleaving scheme which has been used in an interleaver included in the signal transmission apparatus, and outputs the de-interleaved PCH data block to the convolutional decoder 115.

The convolutional decoder 115 performs an error correction operation by performing a Viterbi decoding operation on the de-interleaved PCH data block based on a convolutional encoding scheme which has been used in a convolutional encoder included in the signal transmission apparatus, and outputs the Viterbi decoded PCH data block to the block decoding unit 117.

The block decoding unit 117 block decodes the Viterbi decoded PCH data block based on a block encoding scheme which has been used in a block encoder included in the signal transmission apparatus. The block decoding unit 117 performs an additional error correction operation as well as the error correction operation performed in the convolutional decoder 115 until a preset criterion is satisfied. Accordingly, if a block decoding is succeeded, the block decoding unit 117 transfers a PCH data block which is succeeded in the block decoding to an upper layer.

Figure 2:
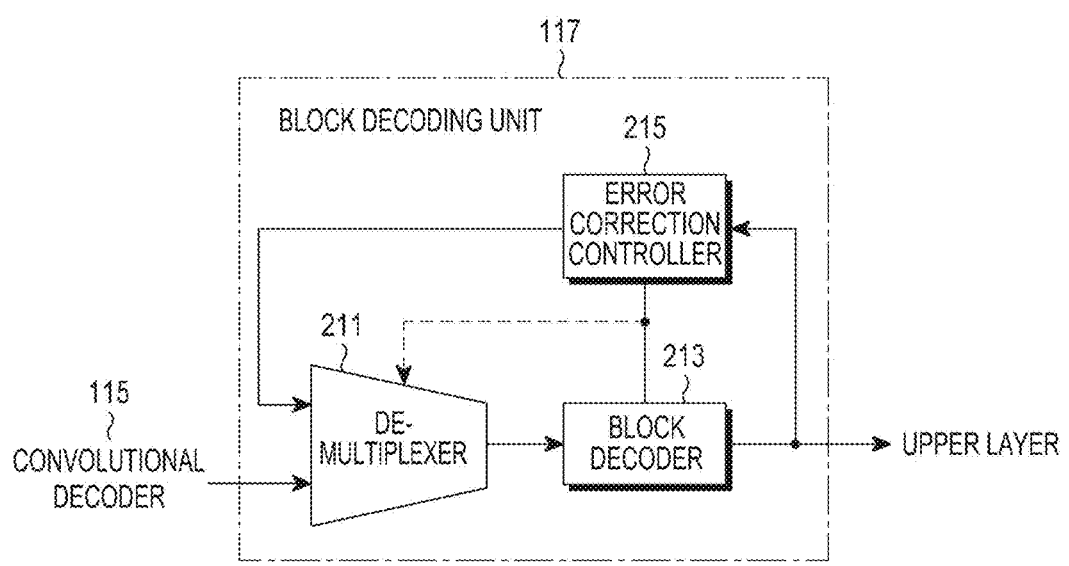
FIG. 2 schematically illustrates an inner structure of a block decoding unit according to an exemplary embodiment of the present invention.

FIG. 2 schematically illustrates an inner structure of a block decoding unit according to an exemplary embodiment of the present invention.

Prior to the description of FIG. 2, a PCH signal received in a signal reception apparatus will be described. First, it will be assumed that paging information data includes 184 bits. According to a block encoding for the paging information data with 184 bits, 40 parity bits and 4 tail bits are generated, so a block encoding sequence with a total of 224 bits including the paging information data with 184 bits, 40 parity bits and 4 tail bits is generated. For example, a block encoding sequence with 224 bits is generated as a coded bit sequence with 456 bits by performing a ½ code rate convolutional encoding operation. The coded bit sequence with 456 bits is divided into a total of 4 bursts, each burst having 114 bits, and a burst with a total of 142 bits is generated by adding a training sequence with 26 bits and 2 stealing flag bits to each of 4 bursts. The generated 4 bursts as a PCH signal are transmitted through 4 GSM frames, respectively. A type of a PCH data block in a GSM communication system according to an exemplary embodiment of the present invention will be described with reference to Tables 1 to 3. A structure of the first type PCH data block in the GSM communication system according to an exemplary embodiment of the present invention is expressed in Table 1.

Prior to the description for Table 1, a PCH data block has different types from the first to the third types according to the number of PCH signals which a Base Station (BS) simultaneously transmits to an MS. The first type PCH data block structure in Table 1 represents a PCH data block structure used if the BS transmits a PCH signal to a maximum of two MSs. As expressed in Table 1, "Mobile Identity" fields are included in the first type PCH data block. The number of "Mobile Identity" fields is equal to the number of the PCH signals which the BS simultaneously transmits. For example, the first type PCH data block includes a total of two Mobile Identity fields, i.e., a Mobile Identity 1 field and a Mobile Identity 2 field, since a BS may simultaneously transmit a maximum of two PCH signals.

In Table 1, an L2 Pseudo Length field indicates a length of a paging information data block, a Radio Resource (RR) management Protocol Discriminator field indicates an identification code of a protocol processing a related message, a Skip Indicator field indicates whether a related message may be omitted, a Paging Request Type 1 Message Type field indicates a message type identified in an upper layer protocol layer, a Page Mode field indicates an operation mode of an MS included in a paging subgroup which receives a paging message, a Channels Needed for Mobiles 1 and 2 field indicates a type of a logical channel for processing a paging transaction, a P1 Rest Octets field indicates dummy bits for padding a remaining part except for the fields, i.e., the L2 Pseudo Length field, the RR management Protocol Discriminator field, the Skip Indicator field, the Paging Request Type 1 Message Type field, the Page Mode field, the Channels Needed for Mobiles 1 and 2 field, the Mobile Identity 1 field, the Mobile Identity 2 field, and the P1 Rest Octets field from the first type PCH data block.

A structure of the second type PCH data block in the GSM communication system according to an exemplary embodiment of the present invention is expressed in Table 2.

TABLE 1

| Information element | Type/Reference | Presence | Format | length |
|---|---|---|---|---|
| L2 Pseudo Length | L2 Pseudo Length | M | V | 1 |
| Radio Resource (RR) management Protocol Discriminator | Protocol Discriminator | M | V | ½ |
| Skip Indicator | Skip Indicator | M | V | ½ |
| Paging Request Type 1 Message Type | Message Type | M | V | 1 |
| Page Mode | Page Mode | M | V | ½ |
| Channels Needed for Mobiles 1 and 2 | Channel Needed | M | V | ½ |
| Mobile Identity 1 | Mobile Identity | M | LV | 2-9 |
| Mobile Identity 2 | Mobile Identity | O | TLV | 3-10 |
| P1 Rest Octets | P1 Rest Octets | M | V | 0-17 |

TABLE 2

| Information element | Type/Reference | Presence | Format | length |
|---|---|---|---|---|
| L2 Pseudo Length | L2 Pseudo Length | M | V | 1 |
| RR management Protocol Discriminator | Protocol Discriminator | M | V | ½ |
| Skip Indicator | Skip Indicator | M | V | ½ |
| Paging Request Type 2 Message Type | Message Type | M | V | 1 |
| Page Mode | Page Mode | M | V | ½ |
| Channels Needed for Mobiles 1 and 2 | Channel Needed | M | V | ½ |
| Mobile Identity 1 | Temporary Mobile Subscriber Identity (TMSI)/ Packet domain TMSI (P-TMSI) | M | V | 4 |
| Mobile Identity 2 | TMSI/P-TMSI | M | V | 4 |
| Mobile Identity 3 | Mobile Identity | O | TLV | 3-10 |
| P2 Rest Octets | P2 Rest Octets | M | V | 1-11 |

The second type PCH data block structure in Table 2 represents a PCH data block structure used if the BS transmits a PCH signal to a maximum of three MSs.

As expressed in Table 2, "Mobile Identity" fields are included in the second type PCH data block. The number of "Mobile Identity" fields is equal to the number of the PCH signals which the BS simultaneously transmits. For example, the second type PCH data block includes a total of three Mobile Identity fields, i.e., a Mobile Identity 1 field, a Mobile Identity 2 field, and a Mobile Identity 3 field since the BS may simultaneously transmit a maximum of three PCH signals.

In Table 2, an L2 Pseudo Length field indicates a length of a paging information data block, an RR management Protocol Discriminator field indicates an identification code of a protocol processing a related message, a Skip Indicator field indicates whether a related message may be omitted, a Paging Request Type 2 Message Type field indicates a message type identified in an upper layer protocol layer, a Page Mode field indicates an operation mode of an MS included in a paging subgroup which receives a paging message, a Channels Needed for Mobiles 1 and 2 field indicates a type of a logical channel for processing a paging transaction, a P2 Rest Octets field indicates dummy bits for padding a remaining part except for the fields, i.e., the L2 Pseudo Length field, the RR management Protocol Discriminator field, the Skip Indicator field, the Paging Request Type 2 Message Type field, the Page Mode field, the Channels Needed for Mobiles 1 and 2 field, the Mobile Identity 1 field, the Mobile Identity 2 field, the Mobile Identity 3 field, and the P2 Rest Octets field from the second type PCH data block.

A structure of the third type PCH data block in the GSM communication system according to an exemplary embodiment of the present invention is expressed in Table 3.

TABLE 3

| Information element | Type/Reference | Presence | Format | length |
|---|---|---|---|---|
| L2 Pseudo Length | L2 Pseudo Length | M | V | 1 |
| RR management Protocol Discriminator | Protocol Discriminator | M | V | ½ |
| Skip Indicator | Skip Indicator | M | V | ½ |
| Paging Request Type 3 Message Type | Message Type | M | V | 1 |
| Page Mode | Page Mode | M | V | ½ |
| Channels Needed for Mobiles 1 and 2 | Channel Needed | M | V | ½ |
| Mobile Identity 1 | TMSI/P-TMSI | M | V | 4 |
| Mobile Identity 2 | TMSI/P-TMSI | M | V | 4 |
| Mobile Identity 3 | TMSI/P-TMSI | M | V | 4 |
| Mobile Identity 4 | TMSI/P-TMSI | M | V | 4 |
| P3 Rest Octets | P3 Rest Octets | M | V | 3 |

The third type PCH data block structure in Table 3 represents a PCH data block structure used if the BS transmits a PCH signal to a maximum of four MSs. As expressed in Table 3, "Mobile Identity" fields are included in the third type PCH data block. The number of "Mobile Identity" fields is equal to the number of the PCH signals which the BS simultaneously transmits. For example, the third type PCH data block includes a total of four Mobile Identity fields, i.e., a Mobile Identity 1 field, a Mobile Identity 2 field, a Mobile Identity 3 field, and a Mobile Identity 4 field since a BS may simultaneously transmit a maximum of four PCH signals.

In Table 3, an L2 Pseudo Length field indicates a length of a paging information data block, an RR management Protocol Discriminator field indicates an identification code of a protocol processing a related message, a Skip Indicator field indicates whether a related message may be omitted, a Paging Request Type 3 Message Type field indicates a message type identified in an upper layer protocol layer, a Page Mode field indicates an operation mode of an MS included in a paging subgroup which receives a paging message, a Channels Needed for Mobiles 1 and 2 field indicates a type of a logical channel for processing a paging transaction, a P2 Rest Octets field indicates dummy bits for padding a remaining part except for the fields, i.e., the L2 Pseudo Length field, the RR management Protocol Discriminator field, the Skip Indicator field, the Paging Request Type 3 Message Type field, the Page Mode field, the Channels Needed for Mobiles 1 and 2 field, the Mobile Identity 1 field, the Mobile Identity 2 field, the Mobile Identity 3 field, the Mobile Identity 4 field, and the P3 Rest Octets field from the third type PCH data block.

As described above, a size of paging information data is relatively small, so there is no data in a remaining part except for a paging information data block in a PCH data block. Accordingly, in a GSM communication system, a preset pattern, e.g., a padding block with 0x2B is included in a block except for the paging information data block in the PCH data block. Here, a padding block having a preset pattern will be called as a "reference padding block".

Referring to FIG. 2, the block decoding unit 117 includes a de-multiplexer 211, a block decoder 213, and an error correction controller 215.

A PCH data block output from a convolutional decoder 115 is input to the de-multiplexer 211. The de-multiplexer 211 de-multiplexes a PCH data block output from the error correction controller 215 and a PCH data block output from the convolutional decoder 115, and outputs the de-multiplexed signal to the block decoder 213. The block decoder 213 decodes the signal output from the de-multiplexer 211 and outputs the block decoded signal to the error correction controller 215.

The error correction controller 215 determines whether the PCH data block output from the block decoder 213 is succeeded for a block decoding, and determines whether there is a need for performing an additional block decoding on the PCH data block output from the convolutional decoder 115 according to the determined result. For example, the error correction controller 215 transfers the PCH data block to an upper layer if a block decoding performed in the block decoder 213 has succeeded, whereas the error correction controller 215 changes a padding block included in the PCH data block to a reference padding block and performs an additional block decoding on the reference padding block if the block decoding performed in the block decoder 213 has failed.

While the de-multiplexer 211, the block decoder 213, and the error correction controller 215 are shown in FIG. 2 as separate units, it is to be understood that this is merely for convenience of description. In other words, the de-multiplexer 211, the block decoder 213, and the error correction controller 215 may be incorporated into a single unit.

Figure 3:
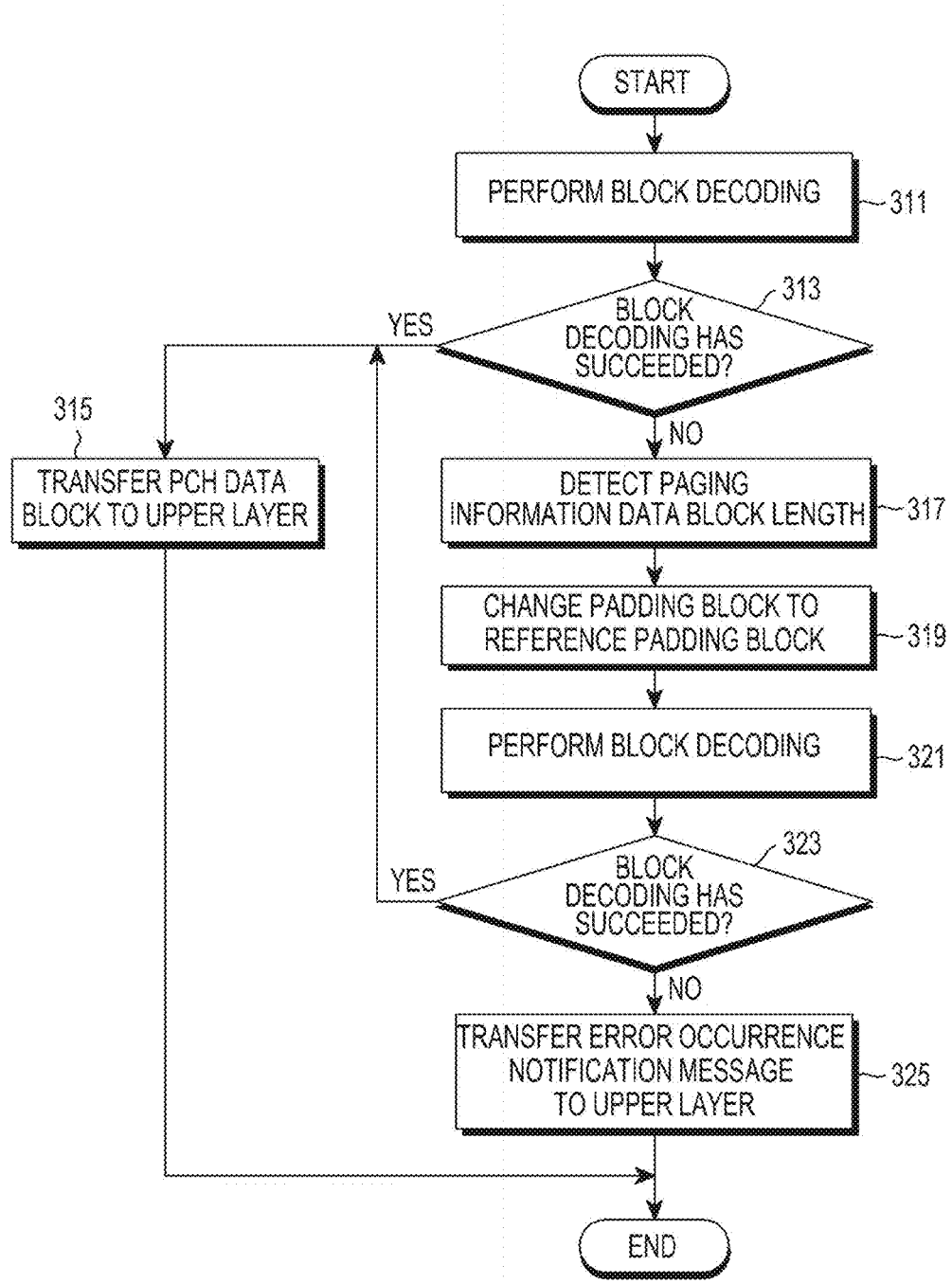
FIG. 3 is a flowchart illustrating a process of a block decoding unit according to an exemplary embodiment of the present invention.

FIG. 3 is a flowchart illustrating a process of a block decoding unit according to an exemplary embodiment of the present invention.

Prior to the description of FIG. 3, an operation process of a block decoding unit 117 as shown in FIG. 3 indicates an operation process which the block decoding unit 117 performs in a case that the block decoding unit 117 knows a length of paging information data included in a paging data block beforehand.

Referring to FIG. 3, the block decoding unit 117 performs a block decoding in step 311. The block decoding unit 117 determines whether the block decoding has succeeded in step 313. If the block decoding has succeeded, the block decoding unit 117 transfers a PCH data block which has succeeded in the block decoding to an upper layer in step 315.

If the block decoding has not succeeded, that is, if the block decoding has failed, the block decoding unit 117 detects a length of the PCH data block in step 317. The block decoding unit 117 changes a remaining padding block except for the paging information data block from the PCH data block to a reference padding block with a preset pattern in step 319. The block decoding unit 117 re-performs a block decoding operation on the PCH data block in which the remaining padding block has been changed to the reference padding block in step 321. The block decoding unit 117 determines whether the block decoding has succeeded in step 323. If the block decoding has succeeded, the block decoding unit 117 proceeds to step 315.

If the block decoding has not succeeded, that is, if the block decoding has failed, the block decoding unit 117 transfers only an error occurrence notification message indicating that the PCH data block decoding has failed to the upper layer, and discards the PCH data block without transferring the PCH data block to the upper layer in step 325.

Figure 4:
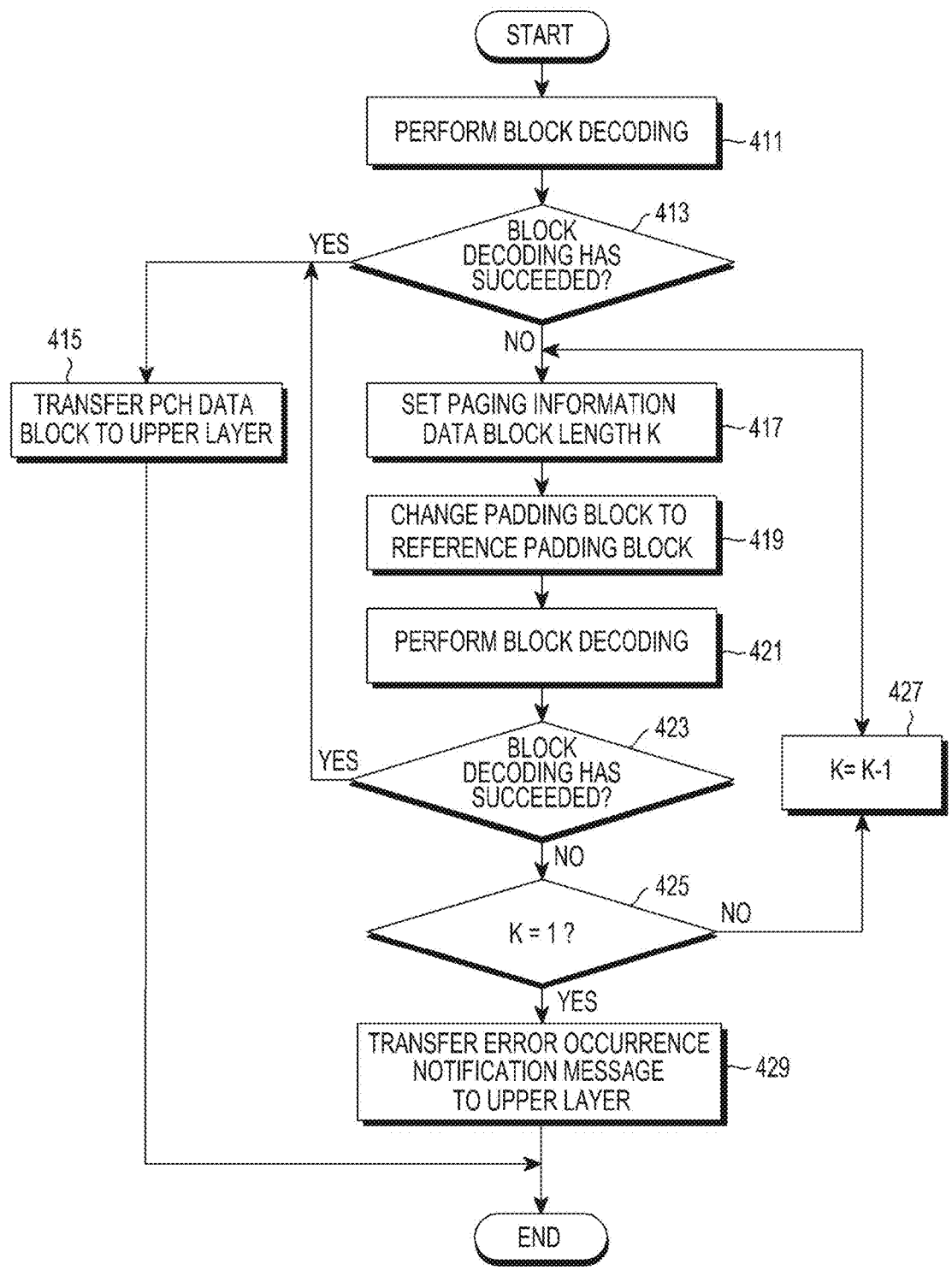
FIG. 4 is a flowchart illustrating a process of a block decoding unit according to an exemplary embodiment of the present invention.

FIG. 4 is a flowchart illustrating a process of a block decoding unit according to an exemplary embodiment of the present invention.

Prior to the description of FIG. 4, an operation process of a block decoding unit 117 as shown in FIG. 4 indicates an operation process which the block decoding unit 117 performs in a case that the block decoding unit 117 does not know a length of paging information data included in a paging data block beforehand.

Referring to FIG. 4, the block decoding unit 117 performs a block decoding in step 411. The block decoding unit 117 determines whether the block decoding has succeeded in step 413. If the block decoding has succeeded, the block decoding unit 117 transfers a PCH data block which has succeeded in the block decoding to an upper layer in step 415.

If the block decoding has not succeeded, that is, if the block decoding has failed, the block decoding unit 117 sets a length K of the paging information data block as a maximum paging information data block length since the block decoding unit 117 does not know the length K of the paging information data block in step 417. The block decoding unit 117 changes a remaining padding block except for paging information data block corresponding to the length K of the paging information data block to a reference padding block with a preset pattern in step 419. The block decoding unit 117 re-performs a block decoding operation on the PCH data block in which the remaining padding block has been changed to the reference padding block in step 421. The block decoding unit 117 determines whether the block decoding has succeeded in step 423. If the block decoding has succeeded, the block decoding unit 117 proceeds to step 415.

If the block decoding has not succeeded, that is, if the block decoding has failed, the block decoding unit 117 determines whether the length K of the paging information data block is equal to '1' in step 425. If the length K of the paging information data block is not equal to '1', the block decoding unit 117 decreases the length K of the paging information data block by a preset value, e.g., '1' (K=K−1) in step 427, and proceeds to step 417.

If the length K of the paging information data block is equal to '1', the block decoding unit 117 transfers only an error occurrence notification message indicating that the PCH data block decoding has failed to the upper layer, and discards the PCH data block without transferring the PCH data block to the upper layer in step 429.

Figure 5:
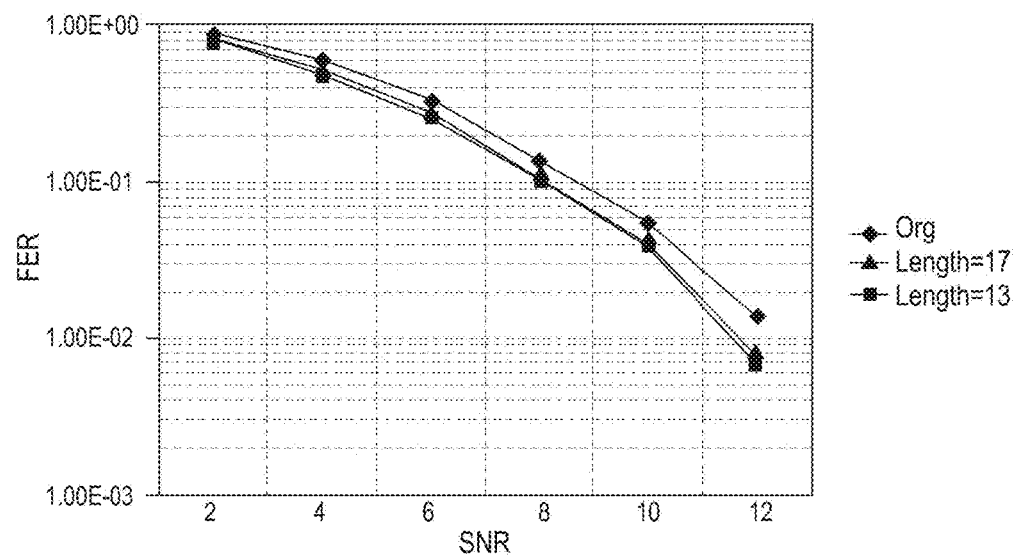
FIG. 5 is a performance gain graph of a block decoding in an Additive White Gaussian Noise (AWGN) environment of a Global System for Mobile communications (GSM) communication system according to an exemplary embodiment of the present invention.

FIG. 5 is a performance gain graph of a block decoding in an Additive White Gaussian Noise (AWGN) environment of a GSM communication system according to an exemplary embodiment of the present invention.

Referring to FIG. 5, a horizontal axis denotes a Signal to Noise Ratio (SNR), and a vertical axis denotes a Frame Error Rate (FER). In FIG. 5, 'Org' indicates a block decoding performance in a case that a normal block decoding scheme is used, 'Length=17' indicates a block decoding performance in a case that the first type PCH data block is used and a length of a padding block is 17 bytes according to an exemplary embodiment of the present invention, and 'Length=13' indicates a block decoding performance in a case that a length of a padding block is 13 bytes according to an exemplary embodiment of the present invention.

As shown in FIG. 5, if a length of a padding block is 17 bytes and an FER is 10%, an approximate 0.8[ dB] performance gain is acquired as compared with a block decoding scheme of the related art. Moreover, an approximate 0.5[ dB] performance gain is acquired if a length of a padding block is 13 bytes as compared with the block decoding scheme of the related art. As shown in FIG. 5, a block decoding performance is described as changing an SNR in an AWGN environment.

Figure 6:
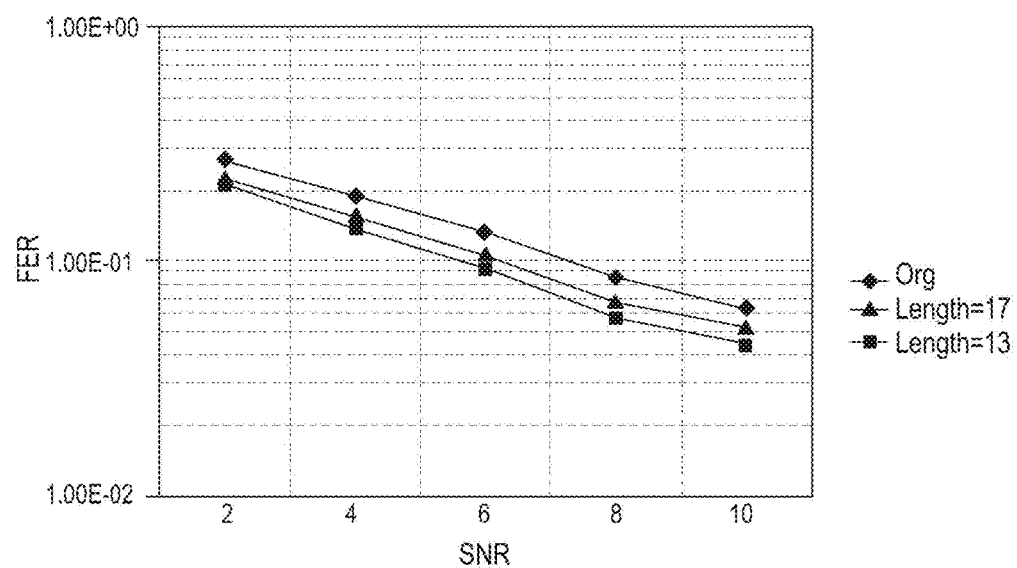
FIG. 6 is a performance gain graph of a block decoding in a channel environment of a GSM communication system according to an exemplary embodiment of the present invention.

FIG. 6 is a performance gain graph of a block decoding in a channel environment of a GSM communication system according to an exemplary embodiment of the present invention.

Referring to FIG. 6, a horizontal axis denotes a Carrier to Interference Ratio (CIR), and a vertical axis denotes an FER.

As shown in FIG. 6, a performance gain approximate 1.8[ dB] may be acquired if a length of a padding block is 17, and a performance gain approximate 1.3[ dB] may be acquired if a length of a padding block is 13. As shown in FIG. 6, a block decoding performance is described as changing a Co-Channel Interference (CCI) in a Typical Urban, 50 km/hr (TU50) channel environment.

As is apparent from the foregoing description, exemplary embodiments of the present invention enable an enhancement for an error detection performance by performing an additional decoding operation using a pattern known between a signal transmission apparatus and a signal reception apparatus in a radio communication system. Exemplary embodiments of the present invention enable an enhancement for a signal decoding performance in a radio communication system, so a total performance of the radio communication system may be enhanced.

Exemplary embodiments of the present invention enable proper reception of a signal in a radio communication system by enhancing a decoding performance even though an MS's reception performance is less than a threshold reception performance in a case that the MS operates in an operation mode in which the MS performs a limited signal reception operation, such as a sleep mode not a normal mode.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method for decoding a channel signal in a signal reception apparatus, comprising:

performing a block decoding operation on a channel signal block; and if the block decoding on the channel signal block fails, re-performing the block decoding operation on the channel signal block using a preset pattern, wherein the re-performing of the block decoding operation on the channel signal block using the preset pattern comprises:

setting a length of an information data block included in the channel signal block as one of predetermined lengths less than or equal to a maximum length of the information data block; and determining a remaining part except for a part corresponding to the set length in the channel signal block as a padding block, and changing the determined padding block to a reference padding block with the preset pattern, wherein the length of the information data block is set to the maximum length for an initial iteration of the re-performing of the block decoding operation.

2. The method of claim 1, wherein the re-performing of the block decoding operation on the channel signal block using the preset pattern further comprises re-performing the block decoding operation on a channel signal block in which the padding block is changed to the reference padding block.

3. The method of claim 1, wherein the channel signal is a paging channel (PCH) signal.

4. The method of claim 1, wherein the decoding of the channel signal is carried out in a decoding unit of the signal reception apparatus.

5. An apparatus for signal reception, comprising:

a block decoding unit configured to:

perform a block decoding operation on a channel signal block, and if the block decoding on the channel signal block fails, re-performing the block decoding operation on the channel signal block using a preset pattern; and a controller configured to:

set a length of an information data block included in the channel signal block as one of predetermined lengths less than or equal to a maximum length information data block, determine a remaining part except for a part corresponding to the set length in the channel signal block as a padding block, and change the determined padding block to a reference padding block with the preset pattern, wherein the length of the information data block is set to the maximum length for an initial iteration of the re-performing of the block decoding operation.

6. The apparatus of claim 5, wherein the block decoding unit is further configured to re-perform the block decoding operation on a channel signal block in which the padding block is changed to the reference padding block.

7. The apparatus of claim 5, wherein the channel signal is a paging channel (PCH) signal.

* * * * *